United States Patent
Shi et al.

(10) Patent No.: US 9,236,856 B2
(45) Date of Patent: Jan. 12, 2016

(54) APPARATUS FOR CONTROLLING SLEW RATE

(75) Inventors: Justin Shi, Ann Arbor, MI (US); Alan Roth, Leander, TX (US); Ying-Chih Hsu, Taichung (TW); Justin Gaither, Austin, TX (US); Eric Soenen, Austin, TX (US)

(73) Assignee: Taiwan Semiconductor Manufactuing Company, Ltd., Hsin-Chu (TW)

( * ) Notice: Subject to any disclaimer, the term of this patent is extended or adjusted under 35 U.S.C. 154(b) by 46 days.

(21) Appl. No.: 12/964,412

(22) Filed: Dec. 9, 2010

(65) Prior Publication Data

US 2012/0146716 A1 Jun. 14, 2012

(51) Int. Cl.
*H03K 5/12* (2006.01)
*H03K 5/01* (2006.01)
*H03K 17/16* (2006.01)
*H02M 1/00* (2007.01)

(52) U.S. Cl.
CPC ...... *H03K 17/163* (2013.01); *H02M 2001/0029* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 4,922,141 A * | 5/1990 | Lofgren et al. | ............... | 327/158 |
| 5,477,180 A * | 12/1995 | Chen | ............... | 327/175 |
| 5,519,338 A | 5/1996 | Campbell et al. | | |
| 5,621,360 A * | 4/1997 | Huang | ............... | 331/57 |
| 5,877,647 A | 3/1999 | Vajapey et al. | | |
| 5,898,321 A | 4/1999 | Ilkbahar et al. | | |
| 6,320,438 B1 * | 11/2001 | Arcus | ............... | 327/175 |
| 6,346,839 B1 * | 2/2002 | Mnich | ............... | 327/158 |
| 6,466,071 B2 * | 10/2002 | Kim et al. | ............... | 327/175 |
| 6,469,559 B2 * | 10/2002 | Heightley | ............... | 327/278 |
| 6,604,206 B2 * | 8/2003 | Chadha et al. | ............... | 713/401 |
| 6,774,693 B2 * | 8/2004 | Carr | ............... | 327/276 |
| 6,798,678 B2 * | 9/2004 | Komurasaki et al. | ............... | 363/157 |
| 7,111,185 B2 * | 9/2006 | Gomm et al. | ............... | 713/401 |
| 7,221,202 B1 * | 5/2007 | Yayla | ............... | 327/158 |
| 7,808,294 B1 * | 10/2010 | Kottapalli | ............... | 327/333 |
| 2011/0241746 A1 * | 10/2011 | Fu | ............... | 327/276 |

* cited by examiner

*Primary Examiner* — An Luu
(74) *Attorney, Agent, or Firm* — Slater & Matsil, L.L.P.

(57) ABSTRACT

An apparatus for controlling slew rate is coupled to two adjustable voltage rails. The output of the apparatus is coupled to the gate of a switching element. By employing two adjustable voltage rails, the slew rate of the switching element is proportional to the voltage difference between the first adjustable rail and the second adjustable rail. The slew rate control apparatus can be applied to a variety of switching elements including N channel Field Effect Transistors (NFETs), P channel Field Effect Transistors (PFETs), current mode logic circuits and level shifter circuits.

19 Claims, 7 Drawing Sheets

APPARATUS FOR CONTROLLING SLEW RATE

BACKGROUND

Many electronic circuits include a switch, such as a power transistor in switching power converters. The gate of the power transistor is typically coupled to a control signal via a driver. In response to the control signal applied to the input of the driver, the power transistor changes between an "on" state and an "off" state. Although the input control signal of the driver may change instantaneously between a logic "low" and a logic "high", the output signal of the driver may not change instantaneously because the gate capacitance of a switching element such as a transistor is charged from a low voltage to a voltage beyond the threshold voltage. As known in the art, the voltage across a capacitor cannot change instantaneously. Therefore, the gate voltage may rise from a low voltage to a high voltage in a period. Such a period is determined by the amount of capacitance at the gate and the amplitude of the drive voltage. In order to better understand the gate voltage transition of a switch, gate voltage slew rate is used to estimate the transition speed of a transistor. As known in the art, the gate voltage change in voltage level over time is defined as gate voltage slew rate.

To improve efficiency in power converters, switches are designed to operate as quickly as possible so as to reduce cross conduction losses. However, such fast transitions may cause electromagnetic interference (EMI) noise, which may cause logic defects in digital circuits or noise in audio circuits. The fast transitions may also cause excessive voltage ripple and switching noise. As a result, high slew-rate induced noise may cause malfunction in some noise-sensitive circuits.

In order to reduce high slew-rate induced noise, slew-rate controlled drivers have been developed to reduce a switch's transition speed. In a prior art slew-rate controlled driver, control circuits are utilized to selectively enable or disable "legs/fingers" of the driver. This may cause complex control algorithms and compensation circuits. In another prior art slew-rate controlled driver, a delay compensation circuit is used to control the turning on and off of different "legs and fingers" of the driver. This may cause unnecessary area penalty. In yet another prior art slew-rate controlled driver, a current control circuit is used to control the driver's current. This may cause additional complexity.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an apparatus for controlling a transistor's slew rate. The invention may also be applied, however, to a variety of semiconductor devices including switching elements.

Figure 1A:
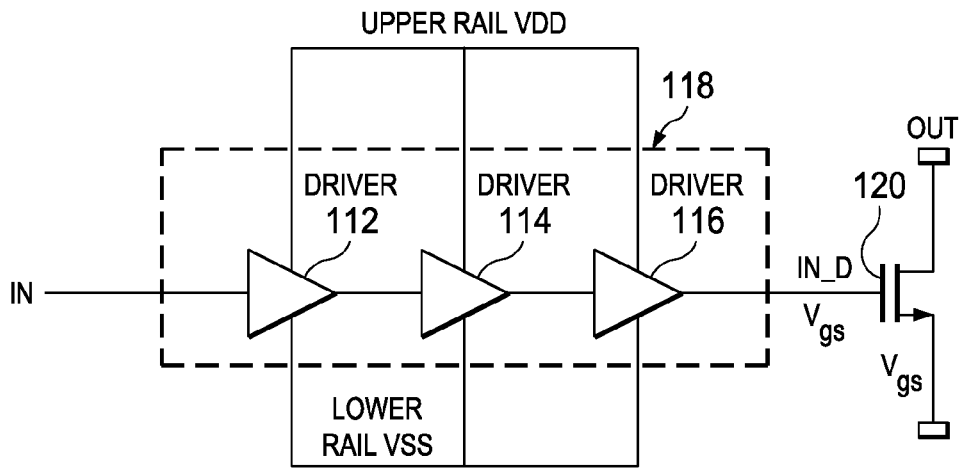
FIG. 1A illustrates a schematic diagram of an N channel Field Effect Transistor (NFET) and its driver.
Figure 1B:
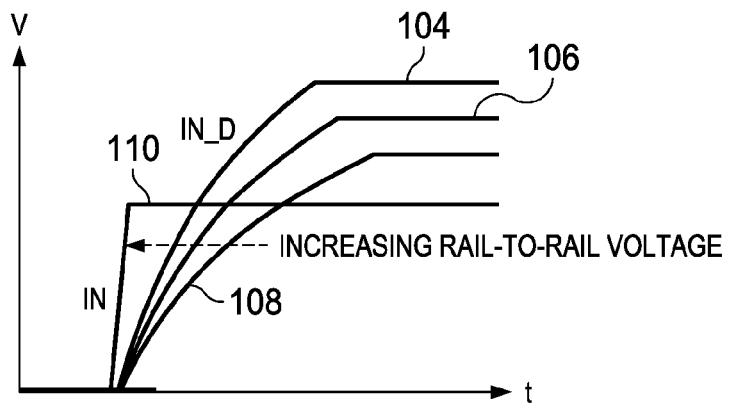
FIG. 1B illustrate a group of gate voltage curves corresponding to different rail-to-rail voltage levels.
Figure 1C:
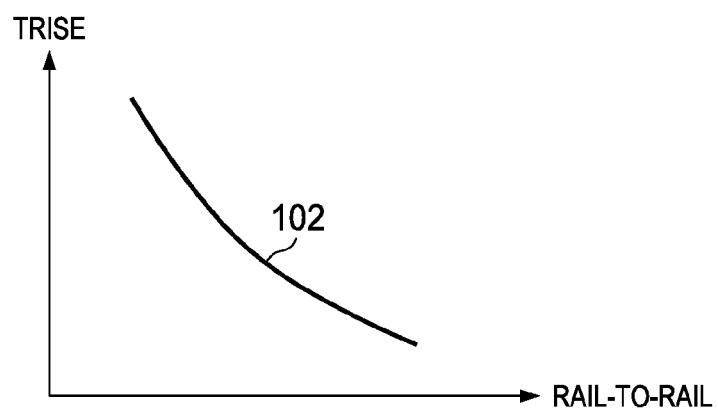
FIG. 1C illustrates the relationship between the rise time of a switch's gate voltage and the rail-to-rail voltage of a driver for the switch.

Referring initially to FIG. 1A-1C, FIG. 1A illustrates a schematic diagram of an N channel Field Effect Transistor (NFET) and its driver. A NFET 120 includes a source, a drain and a gate. In accordance with an embodiment, the drain of the NFET 120 is coupled to a load. The source of the NFET 120 may be connected to a lower voltage rail VSS. The gate of the NFET 120 is connected to an output IN_D of a driver 118. The driver 118 may include several stages. Each stage has a VDD coupled to an upper voltage rail VDD and a VSS coupled to a lower voltage rail VSS. In the subsequent description, the voltage difference between the upper voltage rail VDD and the lower voltage rail VSS is defined as a rail-to-rail voltage.

According to one embodiment, the driver 118 includes a first driver stage 112, a second driver stage 114 and a third driver stage 116. The input of the first driver stage 112 is coupled to a control signal IN. The output of the first driver stage 112 is connected to the input of the second drive stage 114, which has an output connected to the input of the third driver stage 116. The output of the third driver stage 116 is the gate drive signal IN_D, which is capable of turning the NFET 120 on and off according to the control signal IN. One advantageous feature of having multiple driver stages in series connection is that a driver having multiple stages can provide increasing drive strength for each subsequent stage.

It should be noted that while FIG. 1A illustrates the driver 118 with three stages, the driver 118 could accommodate any number of stages. This diagram is merely an example, which should not unduly limit the scope of the claims. One of ordinary skill in the art would recognize many variations, alternatives, and modifications. For example, a variety of driver stages may be arranged either in parallel or in series. One of ordinary of skill in the art will realize that such a variety of driver stages can be an embodiment of the present invention.

FIG. 1B illustrate a group of gate voltage curves corresponding to different rail-to-rail voltage levels. The horizontal axis of FIG. 1B represents intervals of time. The vertical axis of FIG. 1B represents voltage. A curve 110 illustrates the control signal IN (described above with respect to FIG. 1A)

changes from zero to a dc voltage (e.g., 5V) via a slope. In response to the control signal IN, the driver 118 may generate different output curves. FIG. 1B uses three curves 104, 106 and 108 to illustrate the relationship between the slew rate of the output IN_D and the rail-to-rail voltage of the driver (e.g. driver 118). The output IN_D curves shown in FIG. 1B represent gate capacitor charging curves under different rail-to-rail voltages.

The curve 104 corresponding to a relatively high rail-to-rail voltage changes from zero to a dc voltage (e.g., 5V) in a short period of time. Therefore, the curve 104 represents a fast slew-rate gate charge. In contrast, the curve 108 corresponding to a relatively low rail-to-rail voltage rises from zero to the dc voltage in a period longer than the period indicated on the curve 104. As a result, the curve 108 represents a slow slew-rate gate charge. The curve 106 is located between the curve 104 and the curve 108. As indicated by FIG. 1B, the curve 106 represents a driver having a rail-to-rail voltage in a range between the low rail-to-rail voltage indicated by the curve 108 and the high rail-to-rail voltage indicated by the curve 104. In sum, the slew rate of an NFET is proportional to the rail-to-rail voltage of a driver for the NFET.

FIG. 1C illustrates the relationship between the rise time of the gate voltage of a switch and the rail-to-rail voltage of a driver for the switch. The horizontal axis of FIG. 1C represents the rail-to-rail voltage of a driver. The vertical axis of FIG. 1C represents the rise time of a gate voltage. A curve 102 illustrates that a low rail-to-rail voltage results in a longer rise time. In contrast, when a high rail-to-rail voltage is applied to the driver, the rise time is reduced accordingly. The rise time of gate voltage is inversely proportional to the slew rate of a switch (e.g. an NFET). As shown in FIG. 1B, curves 104, 106 and 108 start from zero and stop at three different dc voltage levels. Since the slew rate is defined as the voltage change over time, a higher voltage means a fast slew rate because during a fixed rise period, the slew rate is proportional to the voltage level change. In sum, the curve 102 from a different point of view shows the slew rate of a switch is proportional to the rail-to-rail voltage of a driver for the switch. Furthermore, the slew rate of a switch is not only related to the slew rate at the gate, but also related to the rail-to-rail voltage of a driver.

Figure 2:
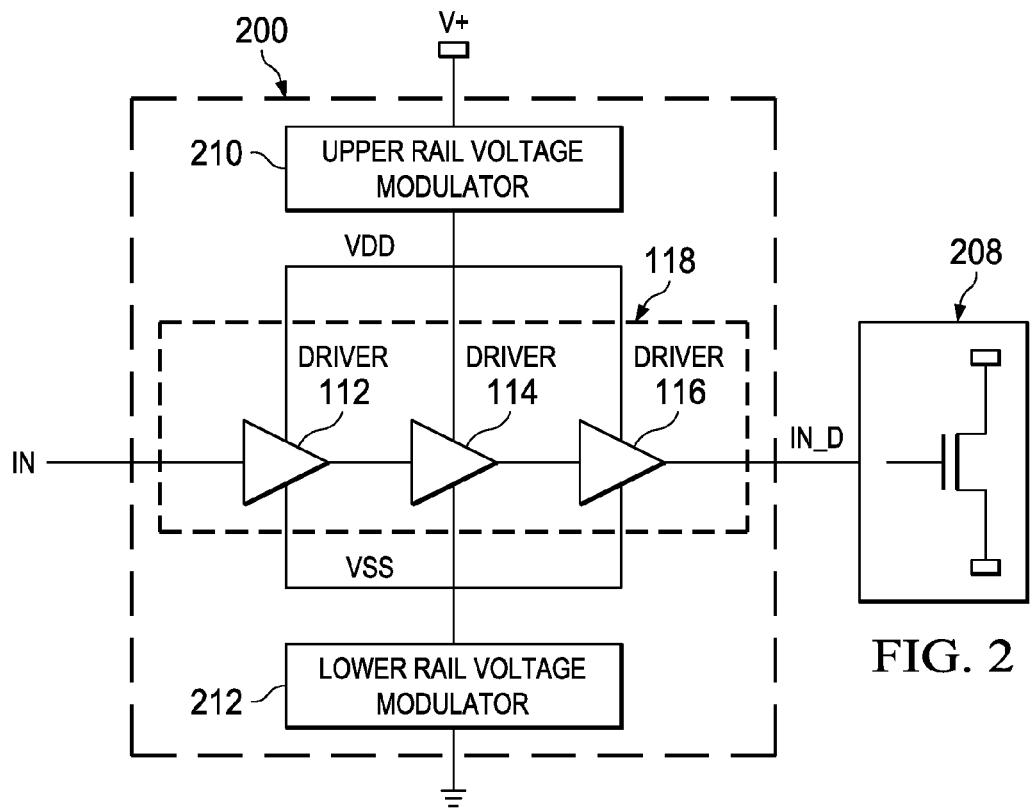
FIG. 2 illustrates a schematic diagram of an apparatus for controlling slew rate in accordance with an embodiment.

FIG. 2 illustrates a schematic diagram of an apparatus 200 for controlling slew rate in accordance with an embodiment. A switching element 208 is an NFET as described above, a P channel Field Effect Transistor (PFET) or the like. The apparatus 200 receives the control signal IN and generates the output IN_D, which is coupled to the gate of the switching element 208. The apparatus 200 includes the driver 118, which has been described in detail with respect to FIG. 1A. The apparatus 200 further comprises an upper rail voltage modulator 210 and a low rail voltage modulator 212. The upper rail voltage modulator has one terminal connected to a voltage source V+ and another terminal connected to the VDD of the driver 118. The low rail voltage modulator 212 has one terminal connected to ground and another terminal connected to the VSS of the driver 118. Both the upper rail voltage modulator 210 and the low rail voltage modulator 212 are capable of adjusting the voltage across their two terminals. As a result, the voltage between VDD and VSS of the driver 118 can be adjusted by controlling the voltage between two terminals of the upper rail voltage modulator 210, the voltage between two terminals of the lower rail voltage modulator 212 or any combination thereof. It should be noted that the apparatus 200 does not have to have all two voltage modulators. The apparatus 200 may have, for example, one voltage modulator, or in alternative embodiments, may have none.

Figure 3:
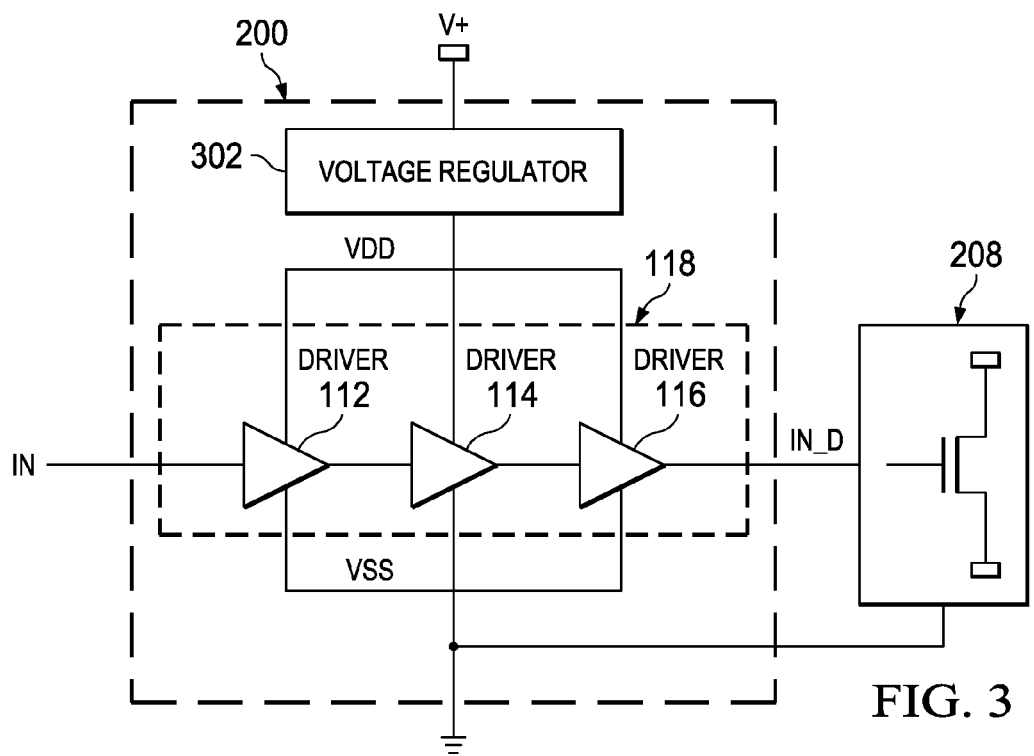
FIG. 3 illustrates an example of controlling the upper rail voltage modulator.

An example of controlling the upper rail voltage modulator is illustrated in FIG. 3. The schematic diagram of FIG. 3 is identical to that of FIG. 2 except that the low rail voltage modulator 212 is removed. In FIG. 3, the VSS of the driver 118 is connected to ground directly. The upper rail voltage modulator 210 is exemplified by a voltage regulator 302. When the voltage between two terminals of the voltage regulator 303 changes in response to a control signal, the voltage between VDD and VSS of the driver 118 changes accordingly. By employing this mechanism, the slew rate of the switching element 208 can be controlled by adjusting the voltage across the terminals of the voltage regulator 302.

As known in the art, the voltage regulator 302 may be implemented through a plurality of voltage regulator topologies, such as linear regulators, switching regulators, charge pumps or the like. An exemplified implementation will be shown in FIG. 4. On the other hand, the voltage regulator 303 may be controlled through various control mechanisms, such as a predetermined voltage, an adjustable voltage through a negative feedback loop or the like. A control mechanism will be discussed in further detail with respect to FIG. 5.

Figure 4:
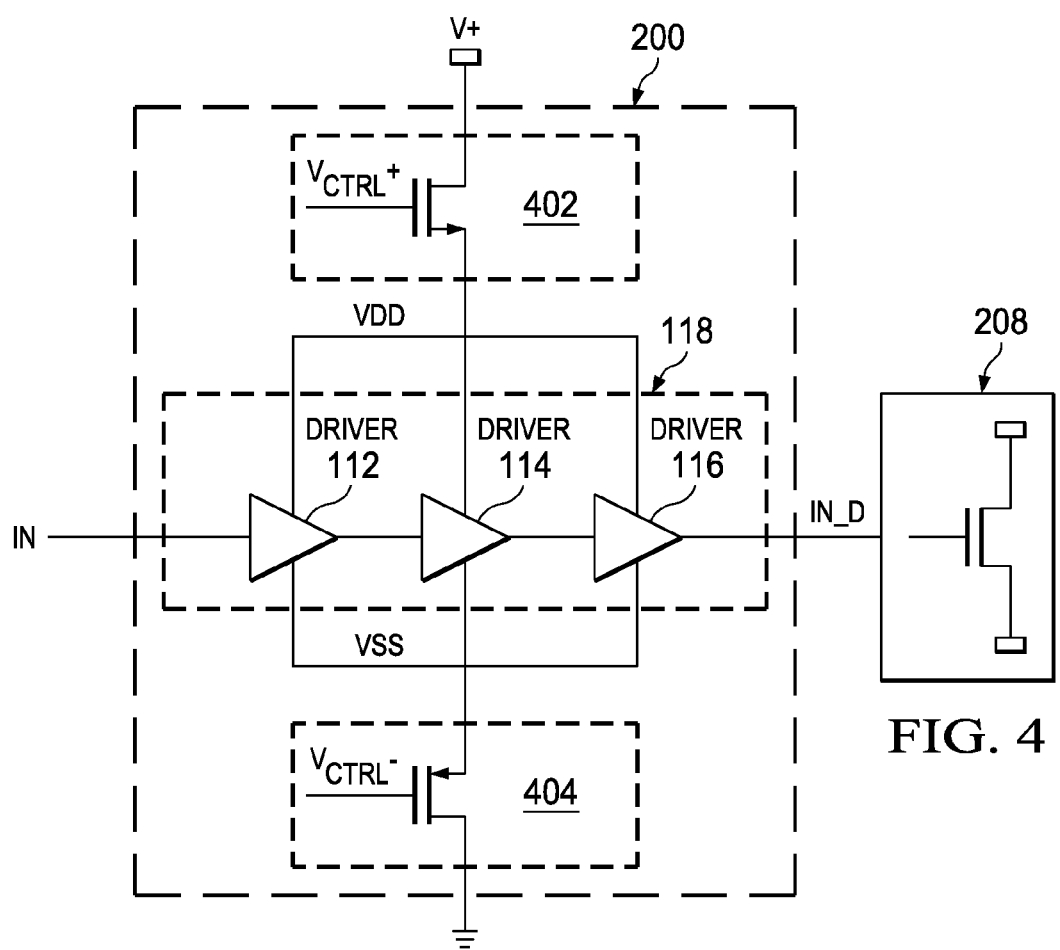
FIG. 4 illustrates an exemplified voltage regulator topology in accordance with an embodiment.

FIG. 4 illustrates an exemplified voltage regulator topology in accordance with an embodiment. In FIG. 4, two source followers 402 and 404 are used to adjust the upper rail voltage VDD and the lower rail voltage VSS. The source follower 402 is placed between the voltage source V+ and the upper rail VDD. The source follower 402 includes a NFET having a drain connected to the voltage source V+, a source connected to the upper rail VDD and a gate connected a control voltage Vctrl+. The detailed information regarding the source follower 402 is not discussed herein because the operation principle of a source follower is known in the art. The dc voltage level of the upper rail VDD is determined by detracting a fixed voltage drop from the control voltage Vctrl+. In other words, the upper rail VDD is proportional to Vctrl+. By adjusting the value of Vctrl+, the upper rail VDD may change accordingly.

Likewise, the source follower 404 is placed between the lower rail VSS and ground. The source follower 404 includes a PFET having a drain connected to ground, a source connected to the lower rail VSS and a gate connected a control voltage Vctrl−. The dc voltage level of the lower rail VSS is determined by adding a fixed voltage from the control voltage Vctrl−. As described above, the rail-to-rail voltage of a driver is defined as the voltage difference between the upper rail VDD and the lower rail VSS. Therefore, the rail-to-rail voltage of the driver 118 is proportional to the voltage difference between Vctrl+ and Vctrl−. By controlling Vctrl+, Vctrl− or any combination thereof, the slew rate of the switching element 208 can be adjusted accordingly. It should be noted that the apparatus 200 does not have to have all two source followers. The apparatus 200 may have, for example, one source follower only, or in alternative embodiments, may have none. It should further be noted that the total number of source followers used in the previous example is selected purely for demonstration purposes and are not intended to limit the various embodiments of the present invention to two source followers.

Figure 5:
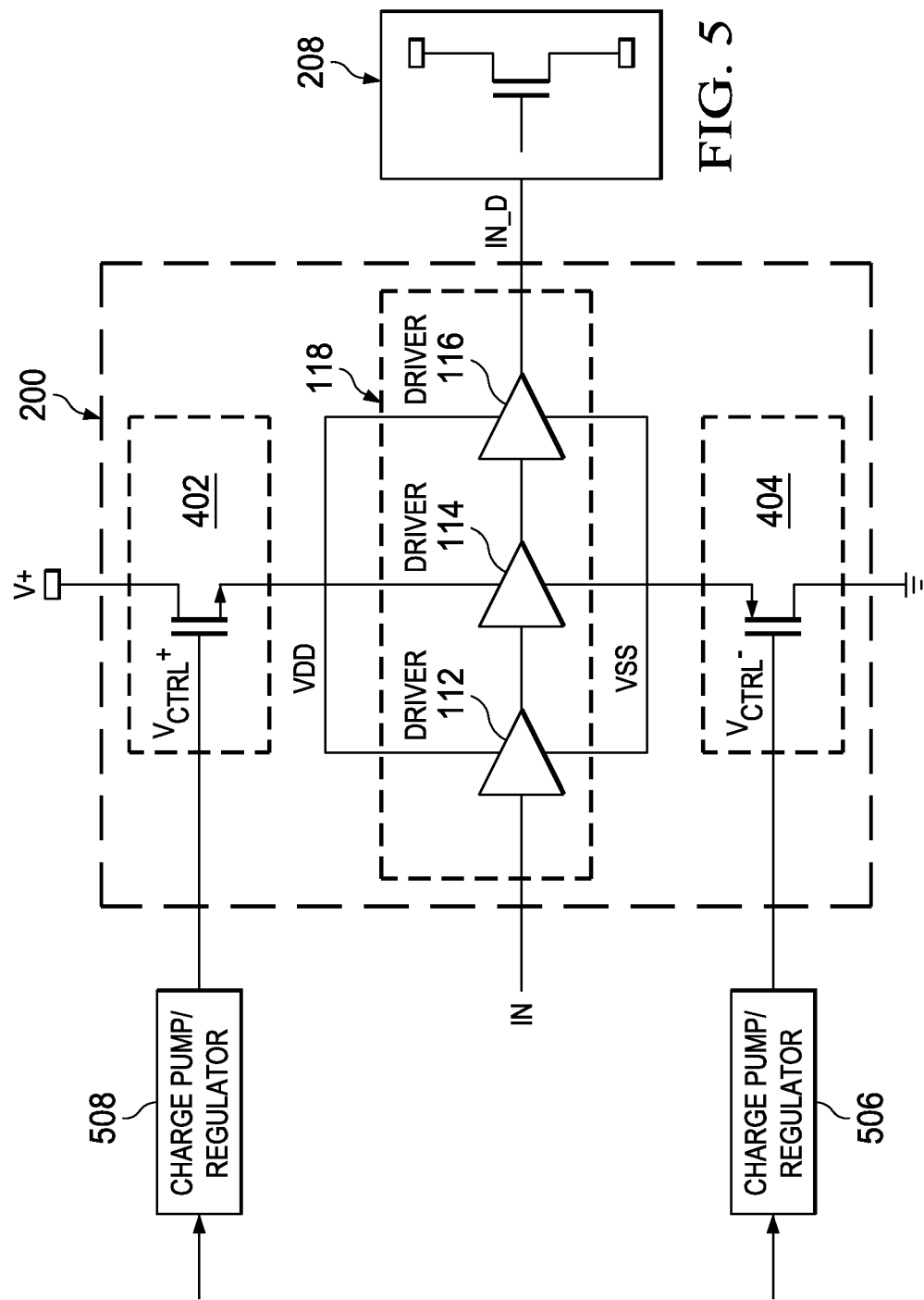
FIG. 5 illustrates an exemplified circuit for generating Vctrl+ and Vctrl−.

FIG. 5 illustrates an exemplified circuit for generating Vctrl+ and Vctrl−. The exemplified circuit includes two charge pumps 506 and 508. The charge pump 506 has an output connected to the gate of the source follower 404. The charge pump 508 has an output connected to the gate of the source follower 402. A user can control Vctrl+, Vctrl− or any combination thereof by sending control signals at the inputs of charge pumps 506 and 508.

Figure 6:
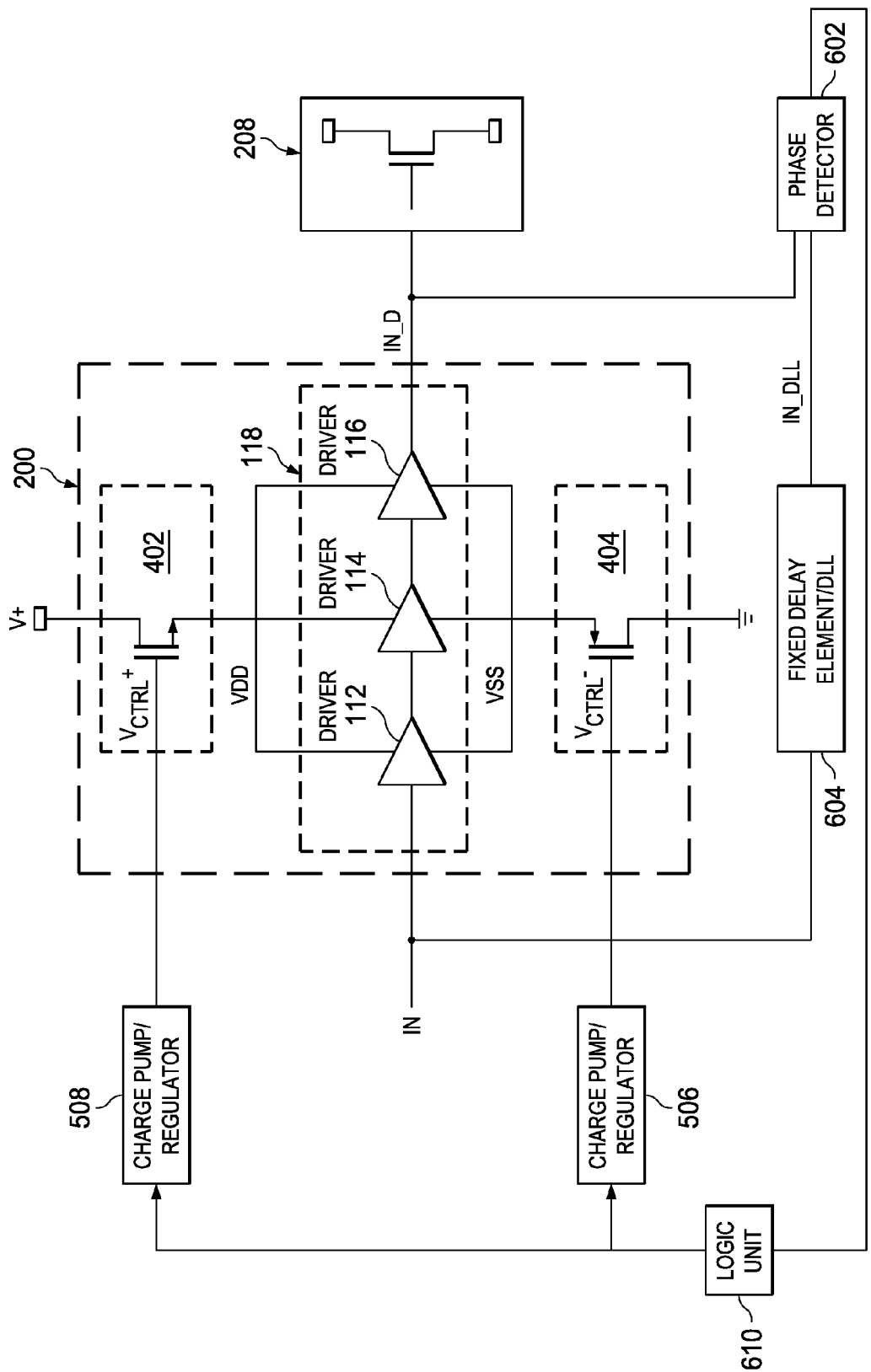
FIG. 6 further illustrates another exemplified control circuit for generating Vctrl+ and Vctrl−.

FIG. 6 further illustrates another exemplified control circuit for generating Vctrl+ and Vctrl−. The control circuit comprises a phase detector 602, a fixed delay element 604, and a logic unit 610. The control signal IN is applied to the input of the driver 118 as well as the input of the fixed delay element 604. The control signal IN is delayed by a period of time after passing the fixed delay element 604. Such a period of time is given by a user's input or determined by a fixed value embedded in the fixed delay element 604. The output of the fixed delay element 604 is connected to a first input of the phase detector 602. Because the operation principle of phase detectors is known in the art, the specification will not discuss it herein. The phase detector 602 receives the output IN_D from a second input and compares the phase of IN_D with the output signal from the fixed delay element 604. The phase detector 602 is capable of monitoring the phase of IN_D in relation to the output signal of the fixed delay element 604.

A negative feedback system is implemented by adjusting Vctrl+ and Vctrl− via two charge pumps 506 and 508. For example, when IN_D has a fast slew rate, that is, the output of the fixed delay element 604 may lag behind IN_D. The phase detector 602 detects the time lag, and then reduces the rail-to-rail voltage by controlling Vctrl+ and Vctrl−. In accordance with an embodiment, the phase detector may send a control signal to the logic unit 610, which may decrease the voltage level of Vctrl+ via the charge pump 508 and increase the voltage level of Vctrl− via the charge pump 506. It should be noted that the control signal from the logic unit 510 may adjust one control voltage only, such as Vctrl+. A person having ordinary skill in the art will recognize that the rail-to-rail voltage of a driver can be controlled by adjusting Vctrl+, Vctrl− or any combination thereof.

As described above with respect to FIG. 4, the rail-to-rail voltage is proportional to the difference between Vctrl+ and Vctrl−. A decrease of Vctrl+ and an increase of Vctrl− may result in a drop of the rail-to-rail voltage. Accordingly, the slew-rate of IN_D is reduced to a level matching the phase of the output signal of the fixed delay element 604. An advantageous feature of this control mechanism is that the feedback system can automatically adjusts Vctrl+ and Vctrl− and set the slew rate of IN_D to a desirable value.

Figure 7A:
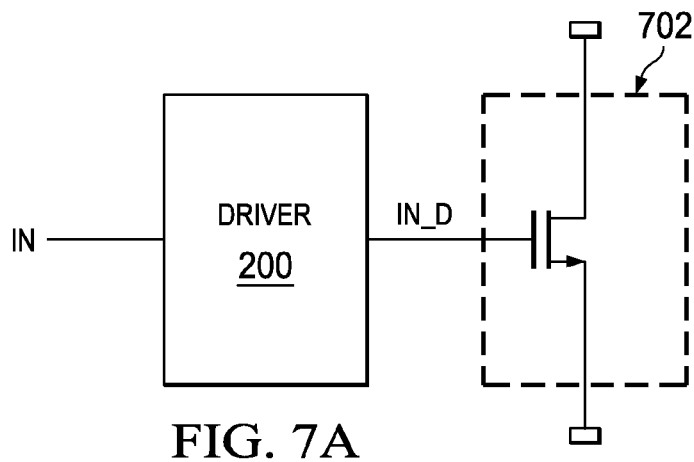
FIGS. 7A-7C illustrate various embodiment systems having slew rate control.
Figure 7B:
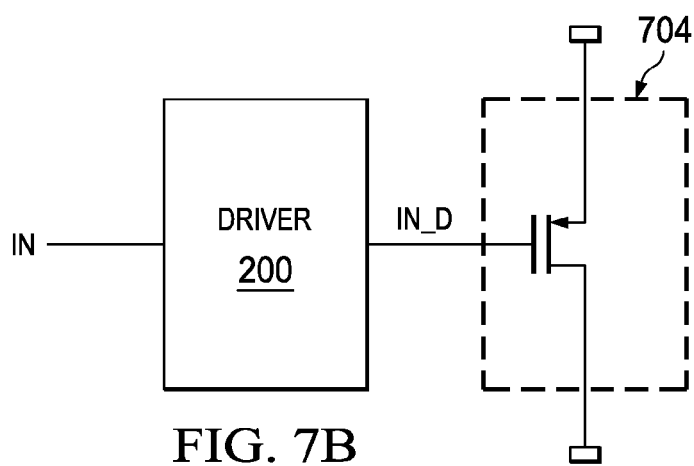
Figure 7C:
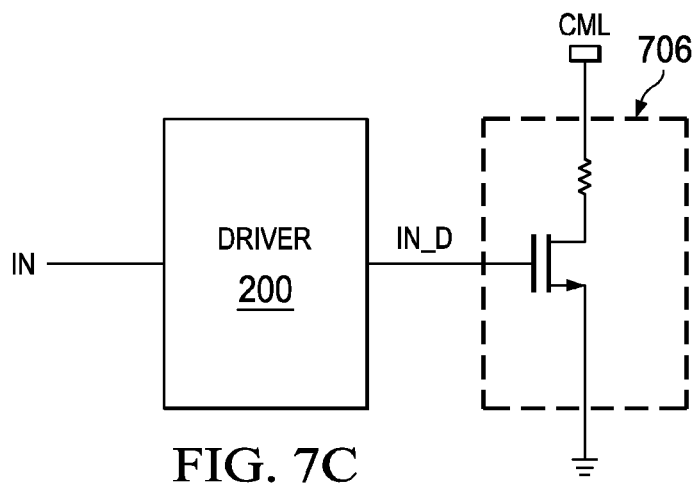

FIGS. 7A-7C and 8A-8B illustrate various embodiment systems having slew rate control. FIG. 7A includes the driver 200, which is described in detail with respect to FIG. 2. In FIG. 7A, the switching element is exemplified by an NFET 702. Alternatively, the driver 200 may be applied to a PFET 704 illustrated in FIG. 7B. Furthermore, FIG. 7C illustrates a Current Mode Logic (CML) switch 706 is driven by the driver 200. The operation of the CML switch 706 is known in the art, and hence is not discussed herein. An advantageous feature of the driver 200 is that the driver 200 as a modular circuit can be applied to a variety of circuits having either NFETs or PFETs.

Figure 8A:
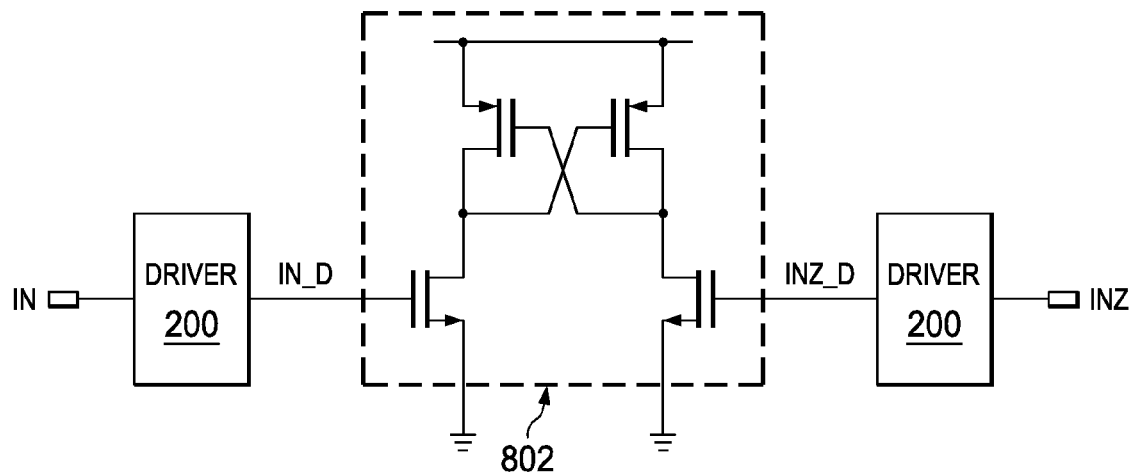
FIGS. 8A and 8B illustrate a level shifter circuit having slew rate control.
Figure 8B:
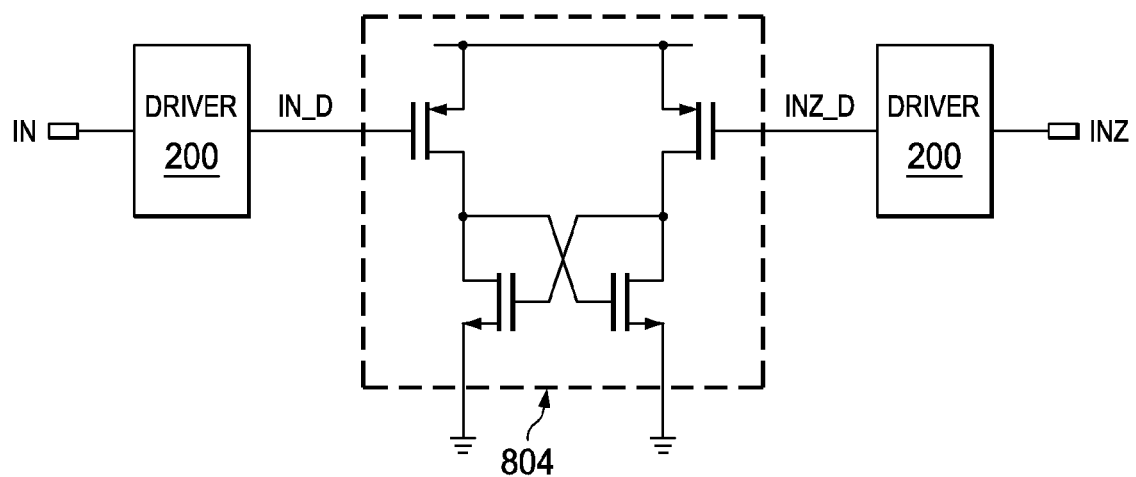

FIG. 8A illustrates a lever shifter circuit having slew rate control. As it is known in the art, the operation of the lever shifter circuit is not discussed herein. A level shifter circuit 802 includes two NFETs, which are driven by two drivers 200 respectively. By employing the driver 200, the slew rate of both NFETs can be controlled accordingly. Alternatively, according to another embodiment, FIG. 8B illustrates a level shift circuit 804 includes two PFETs, which are driven by two drivers 200 respectively. Likewise, the slew rate of two PFETs can be controlled by adjusting the rail-to-rail voltage of the driver 200. One advantageous feature of employing an adjustable rail-to-rail voltage modulator is that the mechanism of controlling slew rate can be applied to driving a single switching element as well as a semiconductor device having a plurality of switching elements.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a plurality of drivers each having a positive terminal and a negative terminal, wherein the drivers are coupled to a gate of a transistor;
   a first rail voltage modulator coupled between a voltage source and the positive terminal of a driver;
   a second rail voltage modulator coupled between the negative terminal of the driver and ground; and a phase detector comprising a first input coupled to the gate of the transistor, a second input coupled to an input of the drivers, and an output coupled to the first rail voltage modulator and the second rail voltage modulator through a negative feedback system, wherein the negative feedback system is configured to reduce a voltage at the positive terminal of the driver through reducing a gate voltage of an n-type voltage follower and increase a voltage at the negative terminal of the driver through increasing a gate voltage of a p-type voltage follower in response to a fast slew rate at the gate of the transistor, and wherein an output voltage of the driver increases from a first voltage to a second voltage in a nonlinear manner in response to voltage changes at the gate voltage of the n-type voltage follower and the gate voltage at the p-type voltage follower.

2. The apparatus of claim 1, wherein the first rail voltage modulator is a first source follower having a gate controlled by a first gate voltage and the second rail voltage modulator is a second source follower having a gate controlled by a second gate voltage.

3. The apparatus of claim 2, wherein the first gate voltage of the first source follower and the second gate voltage of the second source follower are coupled to the output of the phase detector.

4. The apparatus of claim 3, further comprising:
   a fixed delay element having an input coupled to the input of the apparatus and an output coupled to the second input of the phase detector.

5. The apparatus of claim 3, further comprising:
   a first charge pump having an input coupled to the output of the phase detector and an output coupled to the gate of the first source follower; and
   a second charge pump having an input coupled to the output of the phase detector and an output coupled to the gate of the second source follower.

6. The apparatus of claim 1, wherein the first rail voltage modulator is a voltage regulator coupled between a voltage source and the positive terminal of the driver.

7. The apparatus of claim 6, wherein the voltage regulator is controlled by a user's input or a fixed control signal.

8. A system comprising:
a switching element having a gate; and
an apparatus comprising:
a plurality of drivers each having a positive terminal and a negative terminal, wherein the drivers are coupled to the gate of the switching element;
a first rail voltage modulator coupled between a voltage source and the positive terminal of a driver; and
a second rail voltage modulator coupled between the negative terminal of the driver and ground; and
a phase detector comprising a first input coupled to the gate of the switching element, a second input coupled to an input of the drivers, and an output coupled to the first rail voltage modulator and the second rail voltage modulator through a negative feedback system, wherein the negative feedback system is configured to reduce a voltage at the positive terminal of the driver through reducing a gate voltage of an n-type voltage follower and increase a voltage at the negative terminal of the driver through increasing a gate voltage of a p-type voltage follower in response to a fast slew rate at the gate of the switching element, and wherein the voltage at the positive terminal of the driver is equal to the gate voltage of the n-type voltage follower minus a gate-to-source voltage.

9. The system of claim 8, wherein the switching element is a semiconductor device selected from the group consisting of an N channel Field Effect Transistor (NFET), a P channel Field Effect Transistor (PFET), a current mode logic circuit, and a level shifter circuit.

10. The system of claim 8, wherein a slew rate of the switching element is proportional to a voltage difference between the positive terminal and the negative terminal.

11. The system of claim 8, further comprising:
an input signal coupled to an input of the apparatus; and
an output signal coupled to the gate of the switching element.

12. The system of claim 11, wherein the output signal has a delay with respect to the input signal and the delay is proportional to a voltage difference between the positive terminal and the negative terminal.

13. The system of claim 8, wherein the first rail voltage modulator is a first source follower having a gate controlled by a first gate voltage and the second rail voltage modulator is a second source follower having a gate controlled by a second gate voltage.

14. The system of claim 13, wherein the first gate voltage of the first source follower and the second gate voltage of the second source follower are coupled to the output of the phase detector.

15. A method comprising:
monitoring a slew rate of a switching element;
comparing a gate voltage of the switching element with an input voltage of a plurality of drivers coupled to the switching element;
adjusting a first rail voltage modulator coupled between a voltage source and a positive terminal of an apparatus; and
adjusting a second rail voltage modulator coupled between a negative terminal of the apparatus and ground, wherein the first rail voltage modulator and the second rail voltage modulator are configured such that the slew rate of the switching element is proportional to a voltage difference between the positive terminal and the negative terminal, and wherein the slew rate of the switching element is controlled through a comparison between the gate voltage of the switching element and the input voltage of the drivers, and wherein a negative feedback system is configured to reduce a voltage at the positive terminal of the apparatus through reducing a gate voltage of an n-type voltage follower and increase a voltage at the negative terminal of the apparatus through increasing a gate voltage of a p-type voltage follower in response to a fast slew rate at the gate of the switching element, and wherein the voltage at the negative terminal of the apparatus is equal to the gate voltage of the p-type voltage follower plus a gate-to-source voltage.

16. The method of claim 15, further comprising:
sensing a first voltage at an output of the apparatus;
receiving a voltage of an input of the apparatus;
generating a second voltage at an output of a delay element;
comparing the first voltage and the second voltage by means of a phase detector;
generating a control signal at an output of a phase detector; and
controlling the first rail voltage modulator based upon the control signal.

17. The method of claim 15, further comprising:
controlling a second rail voltage modulator based upon a control signal generated by a phase detector.

18. The method of claim 15, wherein the first rail voltage modulator is a first source follower; and wherein the second rail voltage modulator is a second source follower.

19. The method of claim 15, wherein the switching element is a semiconductor device selected from the group consisting of an N channel Field Effect Transistor (NFET), a P channel Field Effect Transistor (PFET), a current mode logic circuit, and a level shifter circuit.

* * * * *

UNITED STATES PATENT AND TRADEMARK OFFICE
CERTIFICATE OF CORRECTION

PATENT NO. : 9,236,856 B2  
APPLICATION NO. : 12/964412  
DATED : January 12, 2016  
INVENTOR(S) : Justin Shi Page 1 of 1

It is certified that error appears in the above-identified patent and that said Letters Patent is hereby corrected as shown below:

On the Title Page, Item (73) Assignee, line 1, delete "Taiwan Semiconductor Manufactuing" and insert --Taiwan Semiconductor Manufacturing--.

Signed and Sealed this  
Twelfth Day of April, 2016

Michelle K. Lee  
*Director of the United States Patent and Trademark Office*